(12) United States Patent
Van Noort et al.

(10) Patent No.: US 8,294,203 B2
(45) Date of Patent: Oct. 23, 2012

(54) CONTACTING AND FILLING DEEP-TRENCH-ISOLATION WITH TUNGSTEN

(75) Inventors: Wibo Daniel Van Noort, Wappingers Falls, NY (US); Peter Deixler, Eindhoven (NL)

(73) Assignee: NXP B.V., Eindhoven (NL)

( * ) Notice: Subject to any disclaimer, the term of this patent is extended or adjusted under 35 U.S.C. 154(b) by 1387 days.

(21) Appl. No.: 11/574,337

(22) PCT Filed: Sep. 2, 2005

(86) PCT No.: PCT/IB2005/052884
§ 371 (c)(1),
(2), (4) Date: Nov. 5, 2007

(87) PCT Pub. No.: WO2006/025037
PCT Pub. Date: Mar. 9, 2006

(65) Prior Publication Data
US 2011/0147884 A1    Jun. 23, 2011

Related U.S. Application Data

(60) Provisional application No. 60/606,979, filed on Sep. 2, 2004.

(51) Int. Cl.
*H01L 29/76* (2006.01)
(52) U.S. Cl. ............... 257/328; 257/341; 257/E21.418; 257/E29.027; 438/270
(58) Field of Classification Search .......... 257/328–331, 257/335, 341, E29.027, E29.256, E21.418; 438/212, 259, 268, 270–272, 589
See application file for complete search history.

(56) References Cited

U.S. PATENT DOCUMENTS

| | | | |
|---|---|---|---|
| 6,078,090 A * | 6/2000 | Williams et al. | 257/476 |
| 6,433,396 B1 * | 8/2002 | Kinzer | 257/369 |
| 6,498,069 B1 | 12/2002 | Grivna | |
| 7,078,782 B2 * | 7/2006 | Shirai et al. | 257/473 |
| 7,102,207 B2 * | 9/2006 | Inoue et al. | 257/656 |
| 2001/0012655 A1 | 8/2001 | Nordstom et al. | |
| 2004/0145058 A1 | 7/2004 | Marty et al. | |
| 2005/0176214 A1 | 8/2005 | Chang et al. | |

FOREIGN PATENT DOCUMENTS

| | | |
|---|---|---|
| EP | 1033751 A2 | 9/2000 |
| EP | 1220312 A1 | 7/2002 |
| JP | 11-214502 A | 8/1999 |
| WO | 02091463 A1 | 11/2002 |

* cited by examiner

*Primary Examiner* — David Vu

(57) ABSTRACT

Electrically isolated, deep trench isolation (DTI) structures, are formed in a wafer, and a portion of the DTI structures are converted to electrically connected structures to provide a shielding function, or to provide connection to deep buried layers. In one aspect, DTI structures include a polysilicon filling over a liner layer disposed on the inner surface of a deep trench, the polysilicon is removed by isotropic etching, and the deep trench is re-filled with a conductive material. Alternatively, the polysilicon filling remains and a contact is formed to provide an electrical connection to the polysilicon. In another aspect, a deep trench is disposed in the wafer such that a lower portion thereof is located within a deep buried layer, and after the polysilicon is removed, an anisotropic etch removes a portion of the deep trench liner from the bottom of the deep trench, thereby allowing a tungsten deposition to make electrical contact with the deep buried layer.

12 Claims, 8 Drawing Sheets

CONTACTING AND FILLING DEEP-TRENCH-ISOLATION WITH TUNGSTEN

The present invention relates generally to semiconductor structures and methods of forming such structures. More particularly, the present invention relates to the conversion of deep trench isolation structures to deep vias for electrical communication with, for example, buried layers and the substrate.

Advances in semiconductor manufacturing technology have allowed the integration of millions of active and passive electrical components into a single chip, or integrated circuit. Many of these advances relate to reducing the size of such electrical components and interconnections, as well as reducing the space, or separation, between these components and interconnections. It is well understood that decreasing the spacing between components and/or interconnections can result in undesired electrical coupling therebetween.

One means of allowing closer placement of components in integrated circuit is the use of Shallow Trench Isolation (STI) structures. Such STI structures typically consist of a shallow trench formed in the surface of a semiconductor substrate, and backfilled with a dielectric material such as, for example, an oxide of silicon. By replacing field oxide regions (e.g., LOCOS) with STI structures, it became possible to reduce the lateral spacing between active semiconductor regions near the surface of the semiconductor substrate.

Similar to STI structures, Deep Trench Isolation (DTI) structures, also provide electrical isolation, but are typically manufactured so as to be substantially deeper than STI structures. In those semiconductor processes which include elements such as, for example, buried layers, DTI structures can be used to provide electrical isolation therebetween.

Modern BiCMOS integrated circuit processes almost invariably include DTI structures as a means of providing the required electrical isolation between electrical nodes that include buried layers. A DTI structure is typically formed as a relatively deep trench (e.g., 4-8 µm) that is etched into the bottom of a STI structure, which is also commonly used in BiCMOS and CMOS processes having feature sizes below those found at the 0.5 µm process technology node.

A DTI structure is conventionally used adjacent to regions with a buried layer (P-type and/or N-type), where it acts as an isolating barrier. The use of DTI structures disposed between closely spaced buried layers significantly reduces the parasitic capacitance between those buried layers (e.g., a buried N layer and a nearby buried P layer). Similarly, the use of DTI structures disposed adjacent buried layers can serve to reduce the parasitic capacitance, which is dominated by the sidewall contribution, between the buried layer and the substrate.

Typically, the DTI trench is provided with an isolating liner layer, such as silicon dioxide 50-400 nm thick, and filled by a plug of polysilicon. The polysilicon plug is merely used for technological reasons, i.e., it has no specific electrical function. The polysilicon plug formed by a low-pressure chemical vapor deposition (LPCVD) process has excellent step-coverage, which facilitates complete filling of the trench. Such polysilicon is also easy to planarize subsequent to its deposition. Additionally this LPCVD polysilicon has a thermal expansion coefficient that is almost identical to that of the surrounding silicon of the substrate, thus mitigating thermal stress during subsequent processing.

As can be seen in FIG. 1, conventional DTI structures are electrically isolated, or electrically floating.

What is needed are methods and apparatus for providing improved electrical isolation and cross-talk suppression between electrical nodes in the substrate, and electrical contact to deep buried layers.

Briefly, a plurality of electrically isolated, deep trench isolation structures, are formed in a semiconductor substrate, and a portion of the deep trench isolation structures are converted to electrically connected structures to provide a shielding function, or to provide connection to deep buried layers.

In one aspect of the present invention, the deep trench isolation structures include a polysilicon filling over a liner layer disposed on the inner surface of a deep trench, and the polysilicon filling is removed by isotropic etching. The deep trench is then re-filled with a conductive material such as tungsten.

In another aspect of the present invention, the polysilicon filling of the deep trench isolation structures is not removed but a contact is formed to provide an electrical connection to the polysilicon.

In a still further aspect of the present invention, a deep trench is disposed in the substrate such that a lower portion of the deep trench is located within a deep buried layer, and after the polysilicon filling is removed from the deep trench, an anisotropic etch is performed to remove a portion of the deep trench liner from the bottom of the deep trench, thereby allowing a subsequent tungsten deposition to make electrical contact with the deep buried layer.

FIG. 1 is a cross-sectional view of a conventional semiconductor substrate including a buried layers separated by deep trench isolation structures.

FIG. 2. is a cross-sectional view of a partially completed semiconductor structure of in accordance with the present invention wherein an opening to through the pre-metal dielectric and the shallow trench isolation fill material to the deep trench isolation fill material is formed.

FIG. 3 is a cross-sectional view of a semiconductor structure in accordance with the present invention illustrating a first deep via that has been selectively etched to remove its polysilicon filling, and a second deep having an electrically isolated filling.

FIG. 4. is a cross-sectional view of the structure of FIG. 1, subsequent to a conductive filling being disposed within the first deep via, and an electrical contact formed that is electrically connected to the conductive filling of the first deep via.

Figure 1:
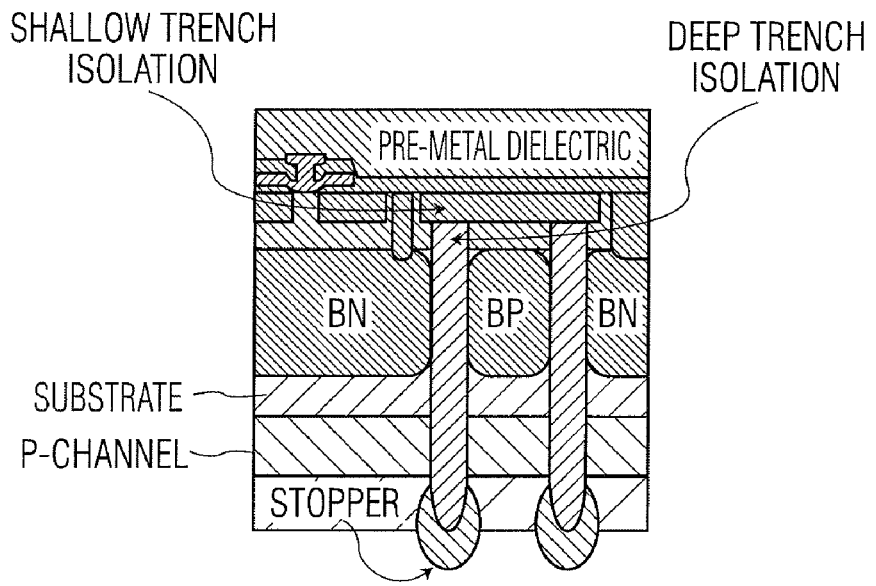

Various embodiments of the present invention provide for the conversion of an electrically floating deep trench isolation structure, to a structure suitable for carrying an electrical signal. In one embodiment, a contact opening is formed through a pre-metal dielectric layer and through the dielectric filling of a shallow trench to reach the top surface of the DTI structure, the filling is removed from the DTI structure and the trench is refilled with tungsten. A tungsten plug in the contact opening allows the tungsten in the deep trench to be connected to power or signal source. In an alternative embodiment, a contact opening is formed through a pre-metal dielectric layer and through the dielectric filling of a shallow trench to reach the top surface of the DTI structure previously filled with polysilicon, and a tungsten plug in the contact opening allows a voltage source to be connected to the highly resistive polysilicon. In a still further alternative embodiment, a contact opening is formed through a pre-metal dielectric layer and through the dielectric filling of a shallow trench to reach the top surface of a DTI structure which extends into a deep buried layer, the filling is removed from the DTI structure, the liner layer of the DTI structure is anisotropically etched to remove that portion of the liner disposed in the bottom of the trench and the trench is refilled with tungsten. A tungsten plug in the contact opening allows the tungsten of the deep trench, which is in electrical contact with the deep buried layer, to be connected to power or signal source.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

The terms chip, integrated circuit, semiconductor device and microelectronic device are sometimes used interchangeably in this field. The present invention relates to the manufacture of chips, integrated circuits, semiconductor devices and microelectronic devices as these terms are commonly understood in the art.

The terms contact, via and window are sometimes used interchangeably in this field, and generally mean an opening in an interlayer insulator which provides a physical pathway for direct electrical connection. In this application the term contact hole refers to the actual opening in the interlayer dielectric, and contact refers to the completed structure including opening and electrically conductive filling.

The term vertical, as used herein, means substantially perpendicular to the surface of a substrate.

Epitaxial layer refers to a layer of single crystal semiconductor material.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Substrate, as used herein, refers to the physical object which is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

Figure 2:
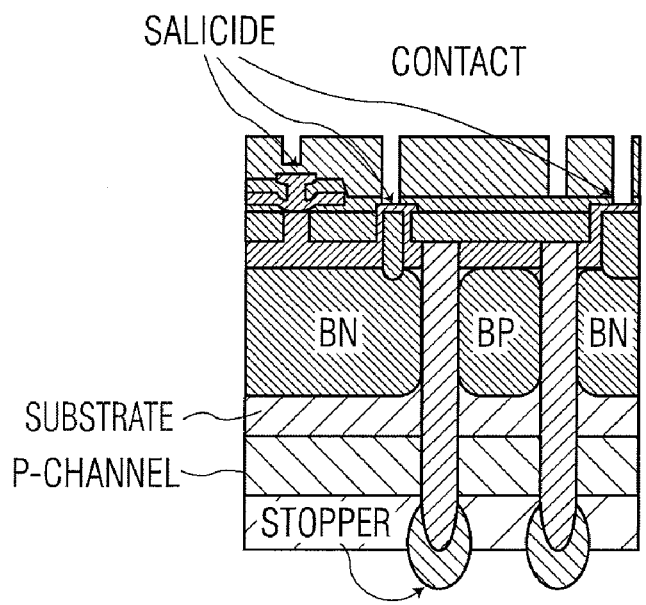

A conventional combination of shallow trench isolation and underlying deep trench isolation structures is depicted in FIG. 1, where a cross-section of a BiCMOS process is shown prior to etching of the contact holes. The design, or layout, of the contact mask is made in such a way that contact holes are present on top of a DTI region. After patterning of a photoresist layer, anisotropic etching is performed, the etching stopping on the silicide layer. The etch time is long enough to reach the underlying polysilicon DTI fill. The result after subsequent photoresist removal is shown in FIG. 2. With respect to the overlap of the contact hole opening to the deep trench from which polysilicon is to be removed, it is noted that in a presently preferred embodiment, only the silicon in the deep trench be exposed to the etch process.

Figure 3:
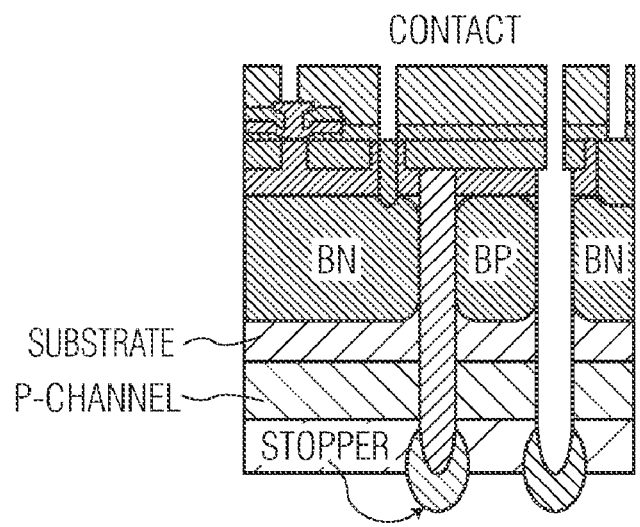
Figure 4:
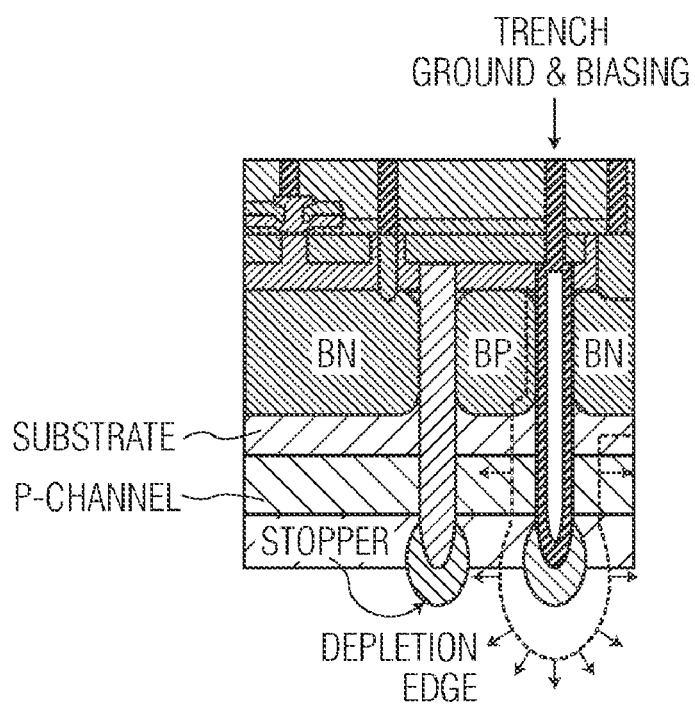

The next step is an isotropic polysilicon etch to dig out the polysilicon from the trenches accessed by the contact hole. Such an etch can be achieved with a dry sulfur hexafluoride ($SF_6$), a wet potassium hydroxide (KOH), or tetramethylammonium hydroxide (TMAH) etching chemistry. The etch must be selective both to silicide and the pre-metal dielectric material (usually silicon oxide). An additional contact mask containing contacts to DTI only, can be used if selectivity to silicide is problematic. The result is shown in FIG. 3. After all the contact holes are opened, the process proceeds with conventional contact fabrication consisting of tungsten filling followed by chemical mechanical polishing (CMP) for planarization. Tungsten filling is typically achieved by means of well-known chemical vapor deposition (CVD) processes for tungsten. It is noted that sputtering or evaporation of tungsten would be problematic because of the depth and aspect ratios of the deep trenches that need to be filled. The result is shown in FIG. 4. The tungsten is then connected to the rest of the interconnect layers in the usual way. FIG. 4 also illustrates that the depletion zone in the semiconductor can be controlled with a potential difference between the trench and the semiconductor (i.e., the substrate).

Figure 5:
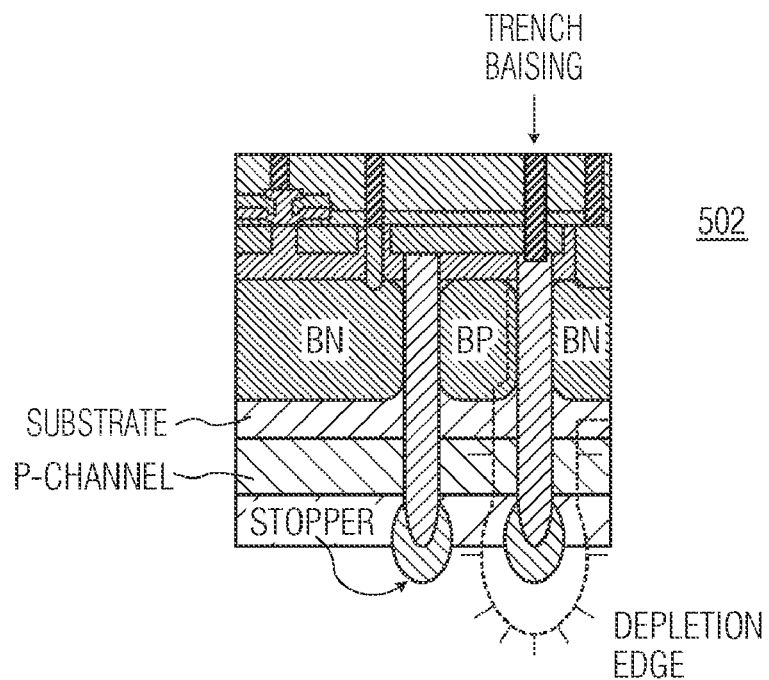
FIG. 5 is a cross-sectional view of an alternative embodiment of the present invention in which the filling of a first deep via electrically connected to contact, the filling of a second deep via is electrically isolated, and the filling of the first and second deep vias is the same.

Some variations on the basic theme can be envisioned that provide either additional functionality or a solution to potential process issues. One variation is shown in FIG. 5, where the isotropic poly etch is omitted and the (usually highly resistive) polysilicon is contacted directly. This simplified approach can be used in situations where only static biasing of the trench is desired.

Figure 6:
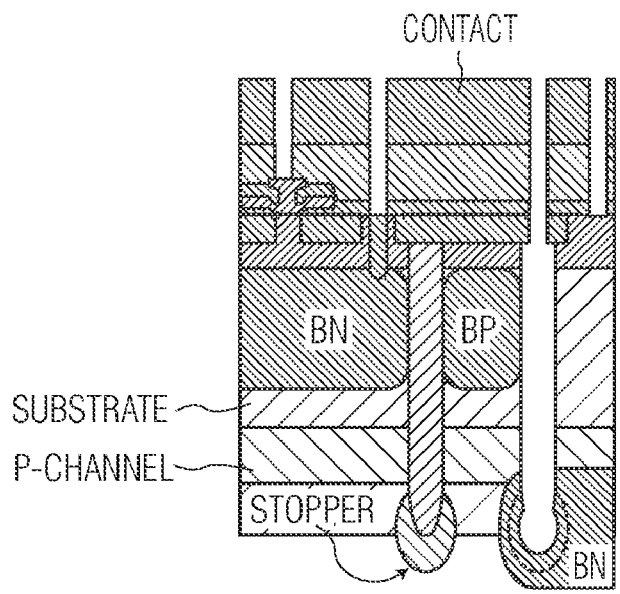
FIG. 6 is a cross-sectional view of another alternative embodiment of the present invention illustrating a deep via that has been selectively etched to remove its filling, and further etched to remove a portion of its lining at the bottom portion of the deep via, thereby forming an opening within a deep buried layer.
Figure 7:
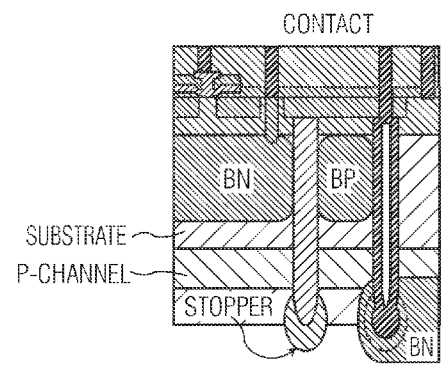
FIG. 7 is a cross-sectional view of the structure of FIG. 4, subsequent to a conductive filling being disposed within the deep via; and an electrical contact formed that is electrically connected to the conductive filling of the deep via, and electrically connected to the deep buried layer.

A second variation can be employed if deep (several μm) buried layers are to be contacted. Referring to FIGS. 6 and 7, this is achieved by performing anisotropic etching after the polysilicon removal from the deep trench. This etch will make a hole in the bottom of the deep trench liner. The subsequently deposited tungsten will electrically contact the opened bottom. The etch is preferably done with the photoresist mask still in place to protect the pre-metal dielectric. Therefore, the polysilicon removal should also be done with the photoresist still in place, which is feasible with a dry, isotropic $SF_6$ etch.

Figure 8:
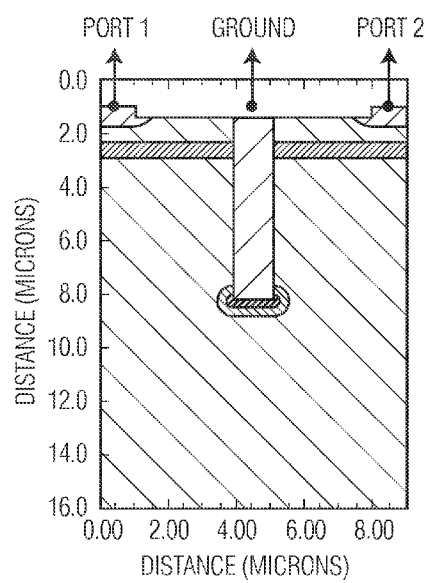
FIG. 8 is a schematic cross-sectional view of a semiconductor structure used to simulate the effects of grounded versus floating trenches.
Figure 9:
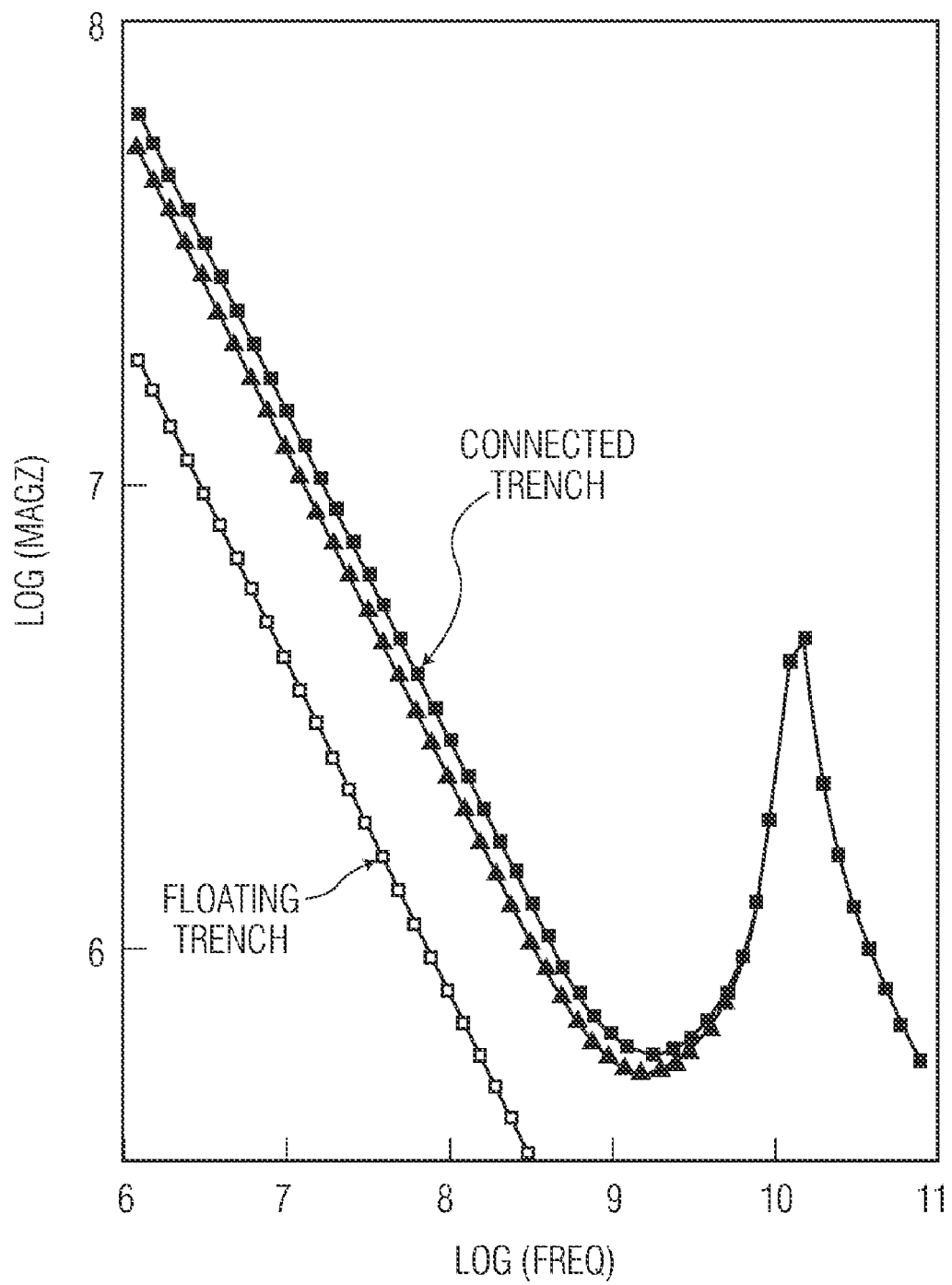
FIG. 9 is a simulation output showing the inverse of the trans-admittance ($1/Y_{12}$) for both a floating and a grounded trench in a substrate.

To illustrate one advantage of such a connected trench, the isolation between two buried layers separated by a trench that is either grounded or left floating has been simulated. The simulated structure is shown in FIG. 8. The inverse of the trans-admittance ($1/Y_{12}$) is shown in FIG. 9. Clearly, connecting the trench significantly increases this number, which is indicative of an increased isolation between the two buried layers. Hence, the connected-trench scheme can be very useful for suppression of crosstalk. Connecting the trench-fill to the substrate as-well by using the second variant could increase this figure even more.

Figure 10:
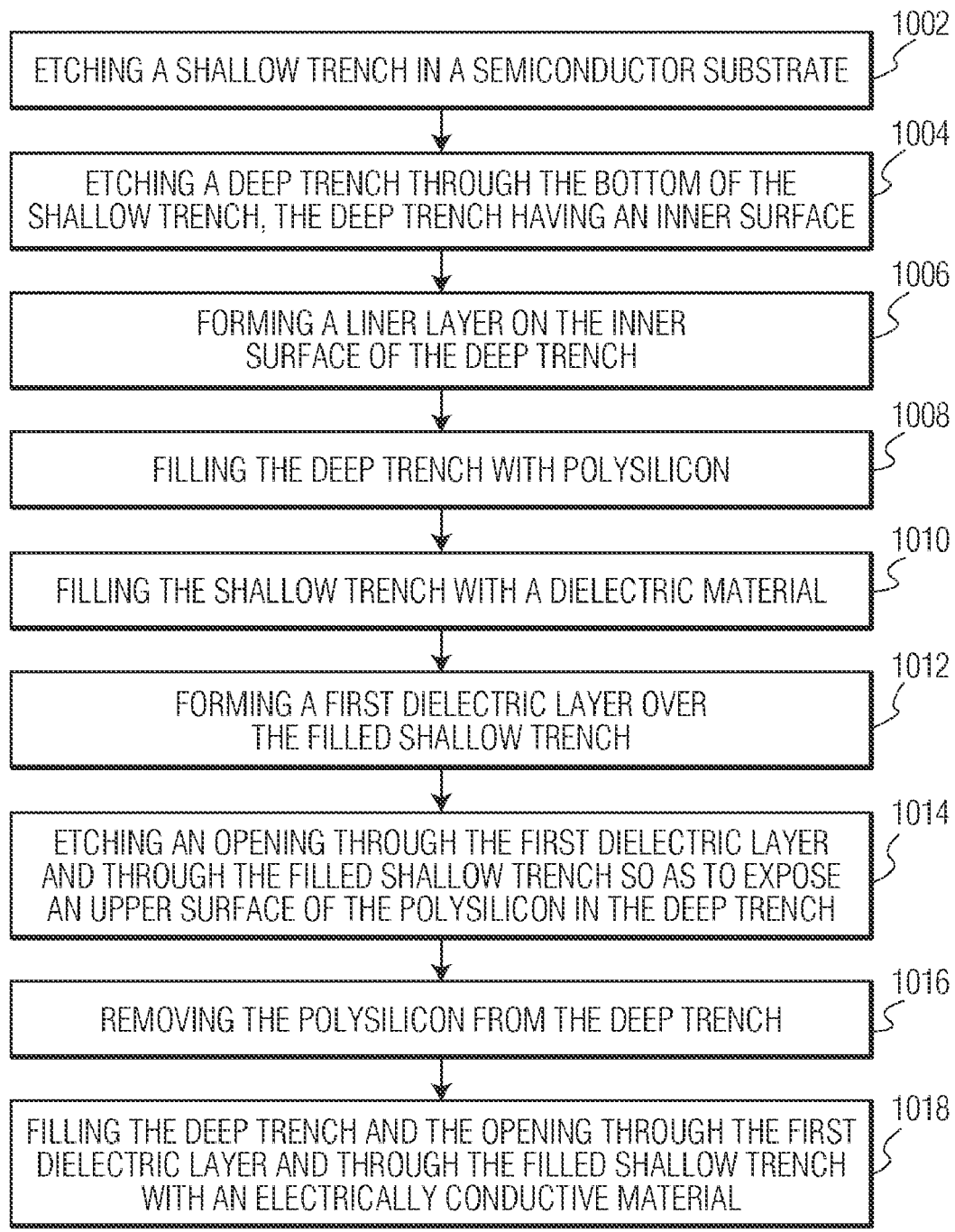
FIG. 10 is a flow diagram illustrating a method of forming a semiconductor structure in accordance with the present invention.

Referring to FIG. 10, an illustrative method of forming a semiconductor structure in accordance with the present invention is described. A semiconductor substrate, such as but not limited to a silicon wafer, is provided, and typically the wafer has a plurality buried layers of various conductivity types. Formation of buried layers is well known in the field of semiconductor manufacturing and is not further described herein. The illustrative method includes etching 1002 a shallow trench in a semiconductor substrate. Shallow trench formation typically includes a forming a layer of photoresist over the surface of the substrate, patterning the photoresist, and removing, by etching, material from the surface of the wafer. Any suitable etch chemistry may be used in accordance with the present invention. A deep trench is then etched 1004 through the bottom of the shallow trench. The deep trench has an inner surface. A liner layer is formed 1006 on the inner surface of the deep trench. The liner layer may be an oxide of silicon. The deep trench is then filled 1008 with polysilicon. Typically the polysilicon is deposited into the deep trench by way of a low-pressure chemical vapor deposition process. The shallow trench is filled 1010 with a dielectric material, such as but not limited to, an oxide of silicon. A first dielectric layer is formed 1012 over the filled shallow trench. The first dielectric layer is typically an oxide of silicon. The first dielectric layer may be referred to as a pre-metal dielectric layer, because it is the dielectric layer that is formed prior to the deposition and patterning of the first general metal interconnect layer. It will be appreciated that various other manufacturing operations may be performed prior to forming the first dielectric layer. For example, masking, diffusion, ion implantation, annealing, oxidation, deposition, silicidation (i.e., refractory metal deposition and heat treatment), and etching are all commonly performed prior to the forming the first dielectric layer. An opening is then etched 1014 through the first dielectric layer and through the filled shallow trench so as to expose an upper surface of the polysilicon in the deep trench. Such openings are typically referred to as contact holes. The polysilicon filling of the deep trench is then removed 1016. It will be appreciated that the polysilicon is removed with an etch chemistry that provides suitable selectivity between the polysilicon and the deep trench liner layer. The illustrative method further includes filling 1018 the deep trench, the opening through the first dielectric layer, and the opening through the filled shallow trench with an electrically conductive material. In this illustrative embodiment, the deep trench and the contact hole are filled with tungsten, however the present invention is not limited to the use of tungsten.

Figure 11:
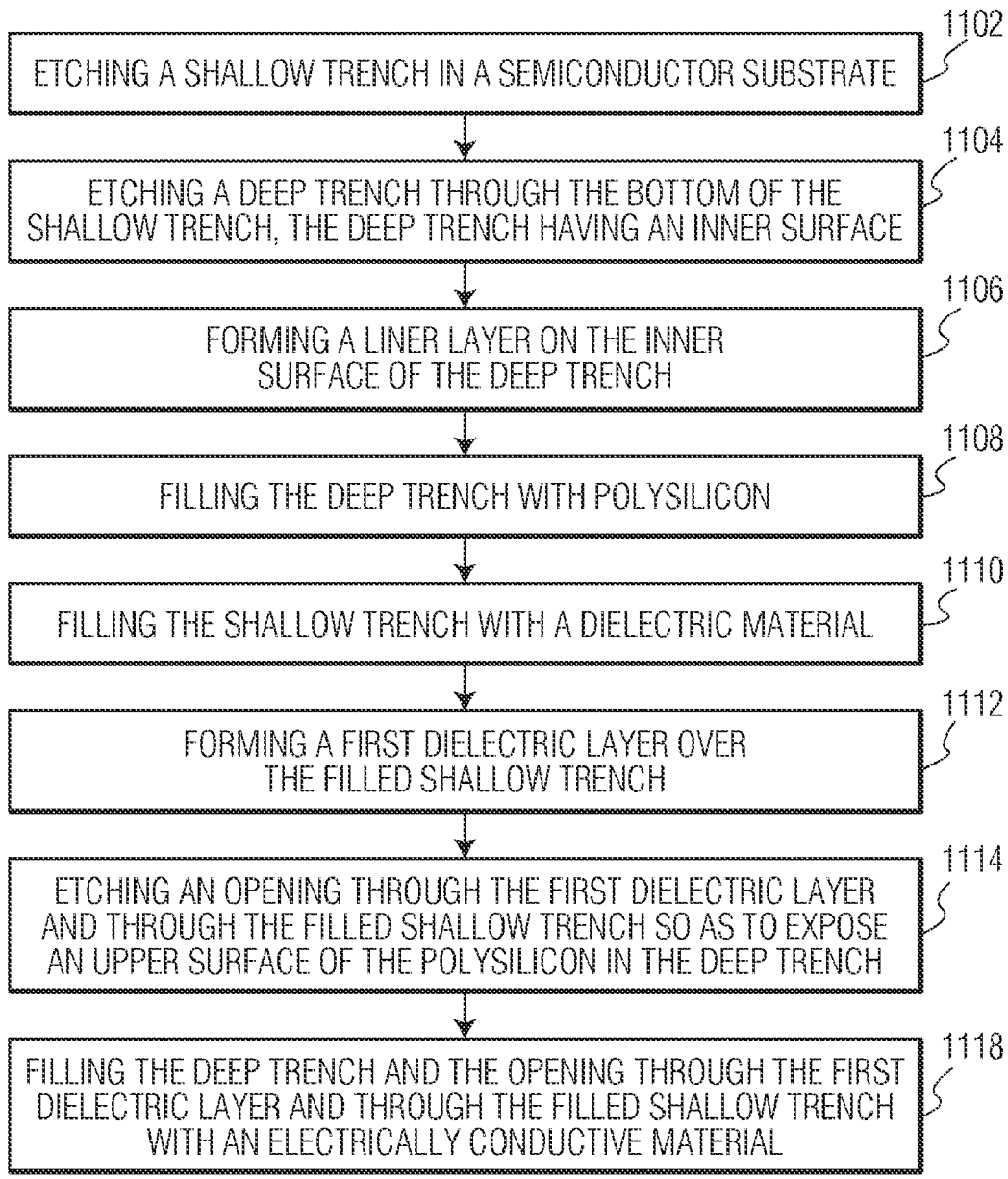
FIG. 11 is a flow diagram illustrating a method of forming an electrical contact to a polysilicon filled deep trench isolation structure disposed under a shallow trench structure in accordance with the present invention.

Referring to FIG. 11, an illustrative method of forming an electrical contact to a polysilicon filled deep trench isolation structure disposed under a shallow trench structure in accordance with the present invention is described. A semiconductor substrate is provided, and typically the substrate has a plurality buried layers of various conductivity types disposed therein. The illustrative method includes etching 1102 a shallow trench in the substrate. A deep trench is then etched 1104 through the bottom of the shallow trench. The deep trench has an inner surface. A liner layer is formed 1106 on the inner surface of the deep trench. The deep trench is then filled 1108 with polysilicon. The shallow trench is filled 1110 with a dielectric material, such as but not limited to, an oxide of silicon. A first dielectric layer is formed 1112 over the filled shallow trench. The first dielectric layer is typically an oxide of silicon. An opening is then etched 1114 through the first dielectric layer and through the filled shallow trench so as to expose an upper surface of the polysilicon in the deep trench. The illustrative method further includes filling 1118 the opening through the first dielectric layer, and the opening through the filled shallow trench with an electrically conductive material. In this illustrative embodiment, the contact hole is filled with tungsten (referred to as a tungsten plug).

Figure 12:
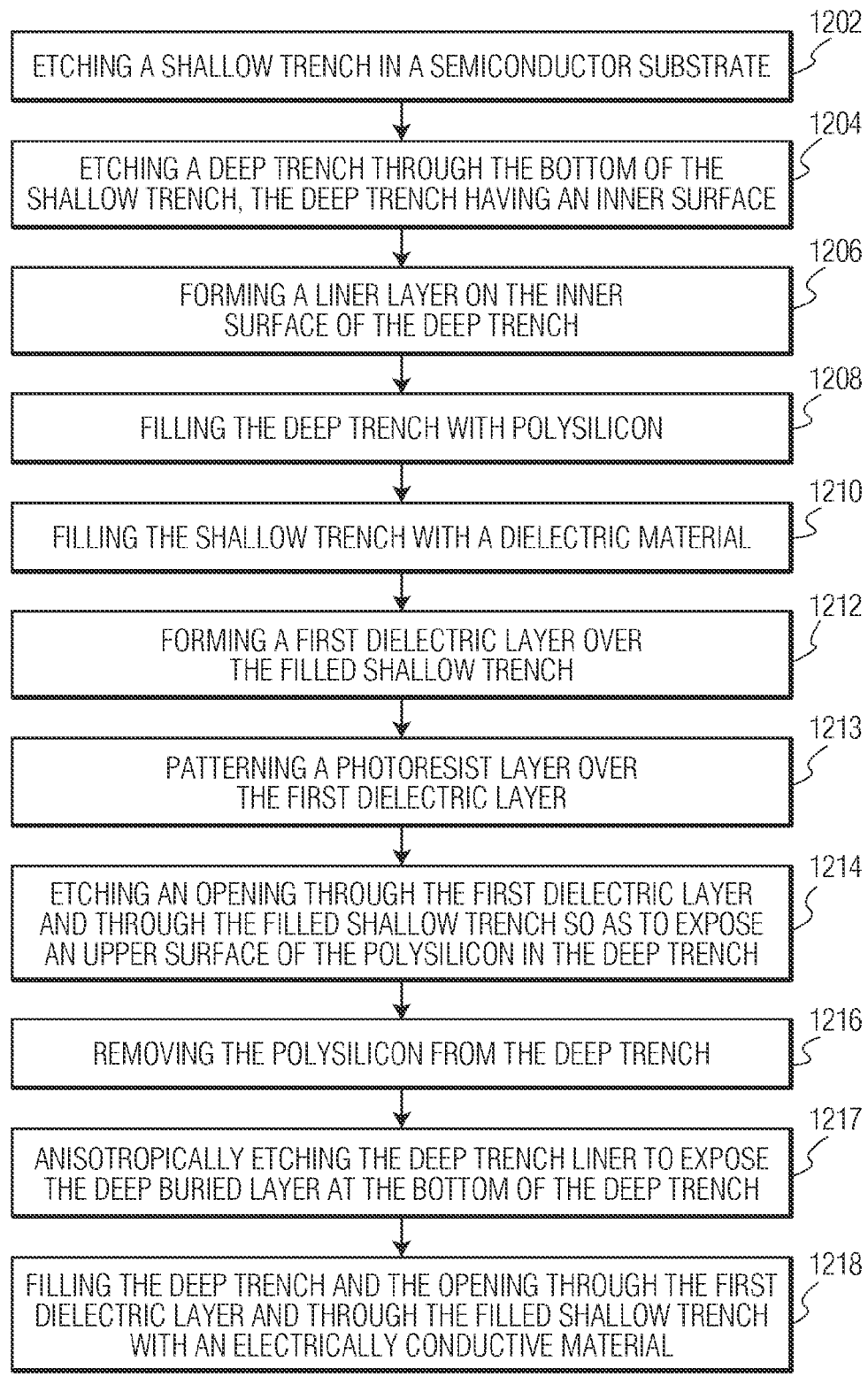
FIG. 12 is a flow diagram illustrating a method of forming an electrical contact to a deep buried layer through a deep trench disposed under a shallow trench in accordance with the present invention.

Referring to FIG. 12, an illustrative method of forming an electrical contact to a deep buried layer through a deep trench disposed under a shallow trench in accordance with the present invention is described. A semiconductor substrate, such as but not limited to a silicon wafer, is provided, and typically the wafer has a plurality buried layers of various conductivity types. Formation of buried layers is well known in the field of semiconductor manufacturing and is not further described herein. The illustrative method includes etching 1202 a shallow trench in the wafer. A deep trench is then etched 1204 through the bottom of the shallow trench. The deep trench has an inner surface. A liner layer is formed 1206 on the inner surface of the deep trench. The liner layer may be an oxide of silicon. The deep trench is then filled 1208 with polysilicon. The shallow trench is filled 1210 with a dielectric material, such as but not limited to, an oxide of silicon. A first dielectric layer is formed 1212 over the filled shallow trench. A photoresist layer is patterned 1213 over the first dielectric layer. An contact hole is then etched 1214 through the first dielectric layer and through the filled shallow trench so as to expose an upper surface of the polysilicon in the deep trench. The polysilicon filling of the deep trench is then removed 1216. It will be appreciated that the polysilicon is removed with an etch chemistry that provides suitable selectivity between the polysilicon and the deep trench liner layer. The illustrative method includes anisotropically etching 1217 the deep trench liner to expose the deep buried layer at the bottom of the deep trench. The illustrative method further includes filling 1218 the deep trench, and the contact hole with an electrically conductive material. In this illustrative embodiment, the deep trench and the contact hole are filled with tungsten, however the present invention is not limited to the use of tungsten.

In various alternative embodiments, the deep trenches may be etched first, and the shallow trenches may be etched subsequently.

Various embodiments of the present invention include methods and apparatus for providing electrical connections into the substrate region by modifying a portion of the deep trench isolation structures found in many semiconductor processes.

An advantage of some embodiments of the present invention is greater electrical isolation between closely electrical elements in integrated circuits.

A further advantage of some embodiments of the present invention is suppression of cross-talk with grounded vertical field-plates.

A still further advantage of some embodiments of the present invention is connection of very deep buried layers.

It is to be understood that the present invention is not limited to the embodiments described above, but encompasses any and all embodiments within the scope of the subjoined Claims.

What is claimed is:
1. A semiconductor structure, comprising:
a substrate, a first buried layer of a first conductivity type disposed within the substrate;
a second buried layer of a second conductivity type disposed within the substrate and space apart from the first buried layer; and
a first deep trench disposed in the substrate between the first buried layer and the second buried layer;
wherein the first deep trench has dielectric liner layer disposed on an inner surface thereof;
a third buried layer of the first conductivity type disposed in the substrate, the third buried contact spaced apart from the second buried layer;
a second deep trench disposed between the second buried layer and the third buried layer, wherein
the second deep trench has a dielectric layer disposed on an inner surface thereof;
the first deep trench extends into the substrate to a depth that is greater than a depth of the first buried layer, and greater than a depth of the second buried layer; and wherein the first conductivity type and the second conductivity types are opposite conductivity types;
the second deep trench extends into the substrate to a depth that is greater than the depth of the second buried layer, and greater than a depth of the third buried layer;
the first deep trench and the second deep trench are disposed below a shallow trench formed in the substrate; and
wherein the first deep trench extends into a deep buried layer, and a filling of material in the first deep trench extends through the bottom of the first deep trench so as make electrical contact with the deep buried layer.

2. A method of forming a semiconductor structure, comprising:
etching a shallow trench in a semiconductor substrate;
etching a deep trench through the bottom of the shallow trench, the deep trench having an inner surface;
forming a liner layer on the inner surface of the deep trench;
filling the deep trench with polysilicon;
filling the shallow trench with a dielectric material;
forming a first dielectric layer over the filled shallow trench;
etching an opening through the first dielectric layer and through the filled shallow trench so as to expose an upper surface of the polysilicon in the deep trench;
removing the polysilicon from the deep trench; and
filling the deep trench and the opening through the first dielectric layer and through the filled shallow trench with an electrically conductive material.

3. The method of claim 2, wherein the liner layer comprises an oxide of silicon, the dielectric material filling the shallow trench comprises an oxide of silicon, and the electrically conductive material filling the deep trench comprises tungsten.

4. The method of claim 3, wherein removing the polysilicon from the deep trench comprises an isotropic polysilicon etch.

5. The method of claim 4, wherein the isotropic polysilicon etch comprises a wet KOH etch.

6. The method of claim 5, wherein the isotropic polysilicon etch comprises a dry $SF_6$ etch.

7. The method of claim 6, wherein removing the polysilicon from the deep trench comprises a selective etch that removes polysilicon, does not remove the first dielectric material, does not remove the shallow trench dielectric fill material, and does not remove metal silicides.

8. The method of claim 7, wherein the isotropic polysilicon etch comprises a tetramethylammonium hydroxide etch.

9. A method of forming an electrical contact to a polysilicon filled deep trench isolation structure disposed under a shallow trench structure, comprising:
etching a shallow trench in a semiconductor substrate;
etching a deep trench through the bottom of the shallow trench, the deep trench having an inner surface;
forming a liner layer on the inner surface of the deep trench;
filling the deep trench with polysilicon;
filling the shallow trench with a dielectric material;
forming a first dielectric layer over the filled shallow trench;
etching an opening through the first dielectric layer and through the filled shallow trench so as to expose an upper surface of the polysilicon in the deep trench; and
filling the opening through the first dielectric layer and through the filled shallow trench with an electrically conductive material.

10. The method of claim 9, wherein the liner layer comprises an oxide of silicon, and the dielectric material filling the shallow trench comprises an oxide of silicon.

11. A method of forming an electrical contact to a deep buried layer through a deep trench disposed under a shallow trench, comprising:
etching a shallow trench in a semiconductor substrate;
etching a deep trench through the bottom of the shallow trench and etching until the bottom of deep trench is disposed within the deep buried layer, the deep trench having an inner surface;
forming a liner layer on the inner surface of the deep trench;
filling the deep trench with polysilicon;
filling the shallow trench with a dielectric material;
forming a first dielectric layer over the filled shallow trench;
patterning a photoresist layer over the first dielectric layer;
etching an opening through the first dielectric layer and through the filled shallow trench so as to expose an upper surface of the polysilicon in the deep trench;
removing the polysilicon from the deep trench;
anisotropically etching the deep trench liner to expose the deep buried layer at the bottom of the deep trench; and
filling the deep trench and the opening through the first dielectric layer and through the filled shallow trench with an electrically conductive material.

12. The method of claim 11, wherein removing the polysilicon is done prior to removing the patterned photoresist layer, and comprises a dry isotropic etch with $SF_6$.

* * * * *